United States Patent

[11] 3,586,981

[72] Inventor Horace A. Johns
Petersfield, England
[21] Appl. No. 756,438
[22] Filed Aug. 30, 1968
[45] Patented June 22, 1971
[73] Assignee Ugo International N.V.
Curacao, Dutch Antilles, Netherlands
[32] Priority Sept. 1, 1967
[33] Great Britain
[31] 40197/67

[54] CARRIER SIGNAL TRIGGERED OSCILLATOR AND DEMODULATOR CIRCUIT
10 Claims, 3 Drawing Figs.

[52] U.S. Cl. .................... 325/349, 331/117, 329/123
[51] Int. Cl. .................... H03b 5/12, H04b 1/16
[50] Field of Search .................... 331/117; 329/122, 123; 325/318, 319, 346, 349, 329, 487

[56] References Cited
UNITED STATES PATENTS

| | | | |
|---|---|---|---|
| 2,935,607 | 5/1960 | Koch .................... | 329/123 |
| 3,127,263 | 11/1965 | Starreveld et al. .......... | 325/349 |

*Primary Examiner*—Robert L. Griffin
*Assistant Examiner*—James A. Brodsky
*Attorney*—Sughrue, Rothwell, Mion, Zinn & MacPeak

ABSTRACT: An oscillator comprises two transistors with directly connected bases. The collector of the second transistor is reactively coupled to a resonant circuit in the collector circuit of the first transistor to provide automatic frequency control. The resonant circuit is capacitively coupled to the emitter of the first transistor. The degree and phase of the coupling is such that the oscillator only oscillates when an input signal having a frequency equal to the resonant frequency is continuously present at the emitter of the first transistor. If the input signal is an amplitude or frequency modulated carrier frequency signal, the oscillator oscillates and the demodulation pattern appears at the output. The oscillator is thus useful in demodulation circuitry, particularly radio and television receivers.

CARRIER SIGNAL TRIGGERED OSCILLATOR AND DEMODULATOR CIRCUIT

This invention relates to electrical circuit arrangements which for convenience are herein termed oscillators. Particular applications of oscillators according to this invention are in frequency-modulated radio signal receivers and television receivers.

The invention also finds application in receivers for receiving amplitude-modulated signals. In these and other applications the oscillator according to the invention serves to perform functions additional to those normally performed by a simple oscillator. In particular embodiments at least, the oscillator may more completely be described as a carrier signal triggered oscillator and demodulator circuit arrangement.

According to the present invention there is provided an oscillator comprising a first and a second transistor having directly connected bases, a resonant circuit in the collector circuit of the first transistor, the collector of the second transistor being reactively coupled to said resonant circuit, and the resonant circuit being reactively coupled to the emitter of the first transistor to establish a feedback path, the degree and phase of the coupling being such that the oscillator only oscillates when a signal having a frequency substantially equal to the resonant frequency of said resonant circuit is present at the emitter of the first transistor.

The invention also provides a circuit arrangement for demodulating amplitude and frequency-modulated signals utilizing an oscillator according to the invention.

The invention further provides a radio receiver and a television receiver utilizing an oscillator according to the invention.

The invention further provides an oscillator comprising a first and a second transistor having directly connected bases, a resonant circuit in the collector circuit of the first transistor, the collector of the second transistor being reactively coupled to said resonant circuit, and the resonant circuit being reactively coupled to the emitter of the first transistor to establish a feedback path, the degree and phase of the coupling being such that the oscillator oscillates substantially at the resonant frequency of said resonant circuit only when a signal having substantially a predetermined frequency is present at the emitter of the first transistor.

The resonant circuit is preferably capacitively coupled to the emitter of the first transistor, suitably by means of a tickler lead from the emitter disposed adjacent to a capacitor in the resonant circuit, or advantageously inserted within a ceramic casing of said capacitor and sealed in position.

The degree of coupling is such that the oscillator is below the oscillating condition to an extent sufficient to avoid it being triggered into oscillation by spurious noise signals which may appear at the emitter of the first transistor.

Figure 1:
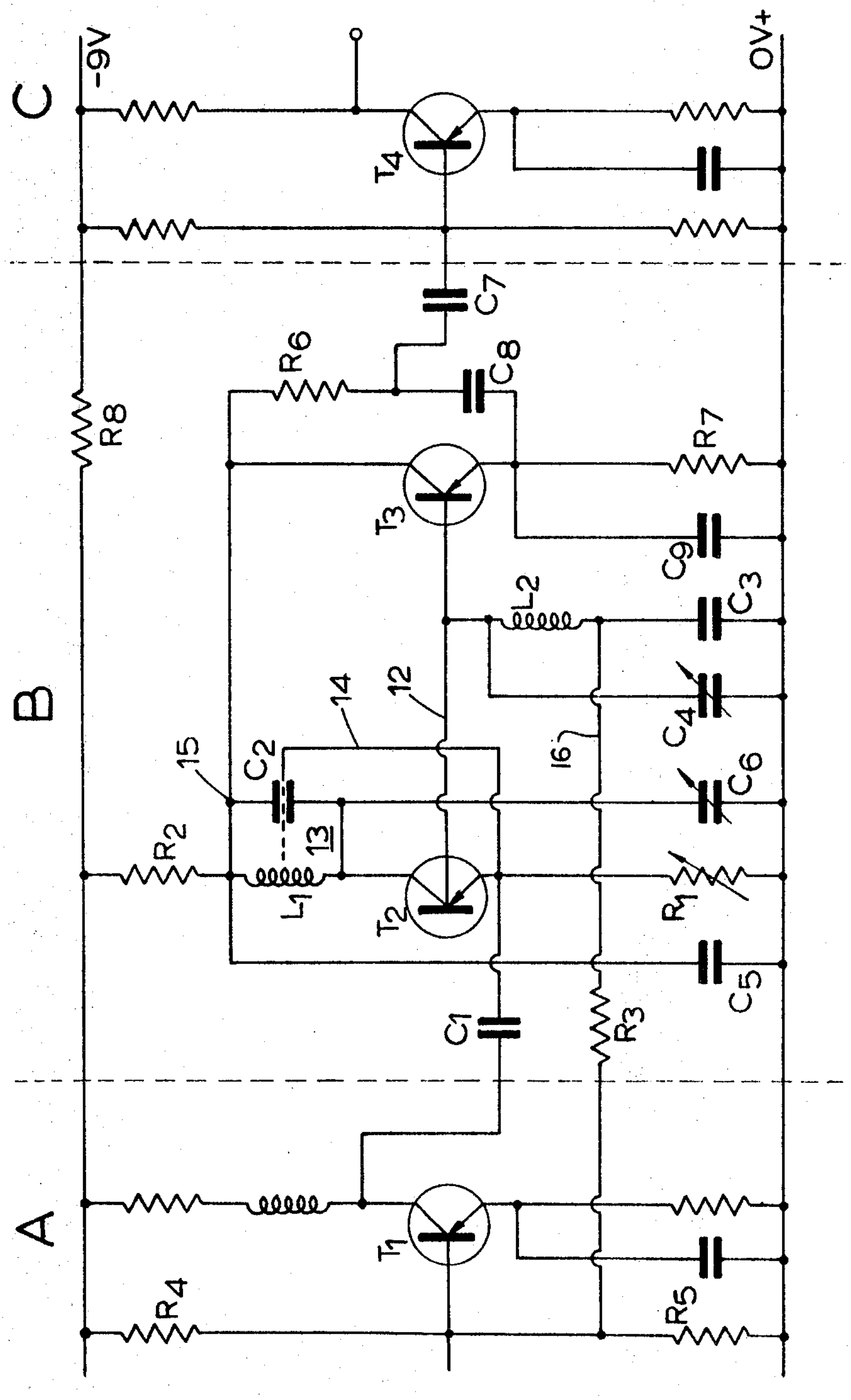
Figure 2:
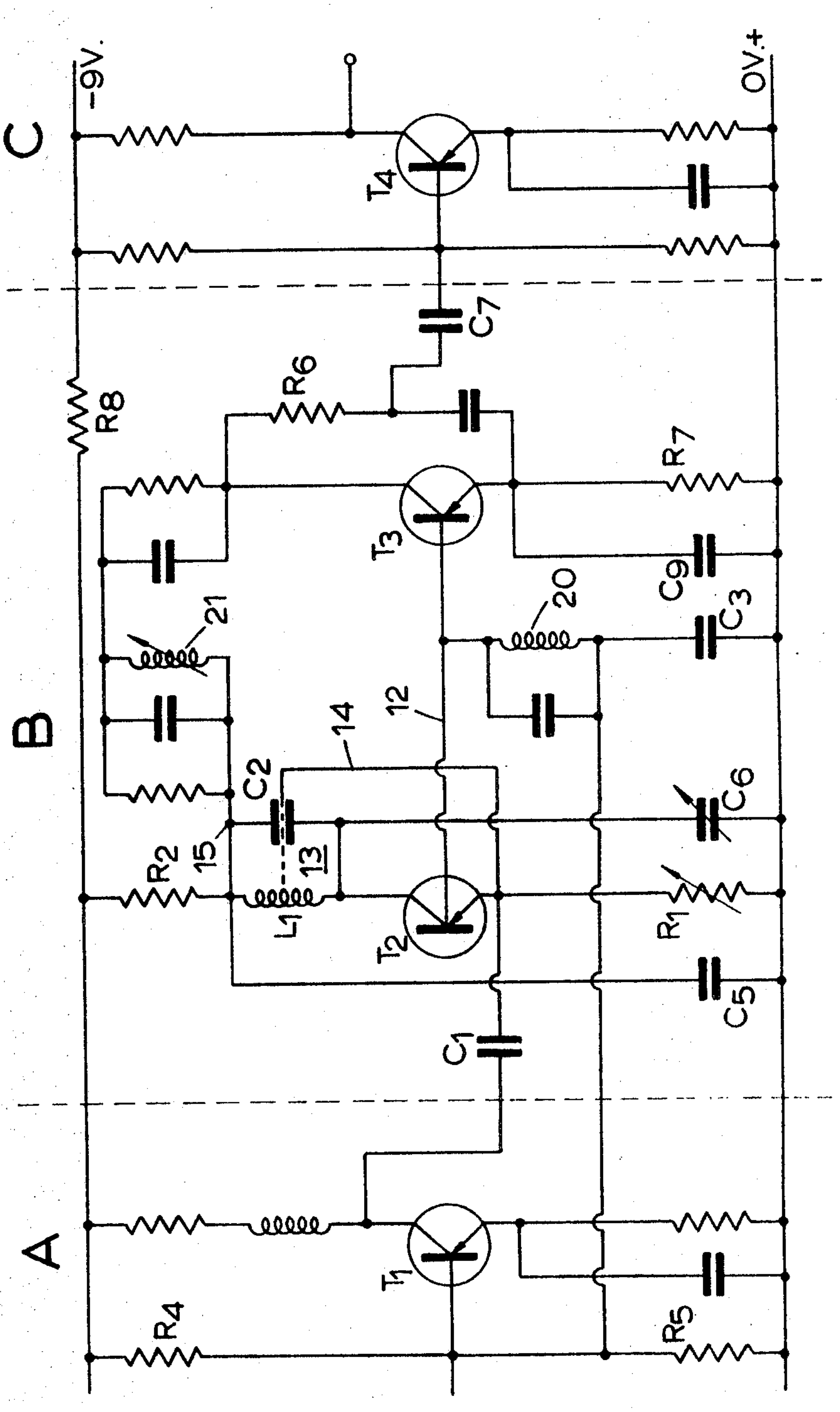
Figure 3:
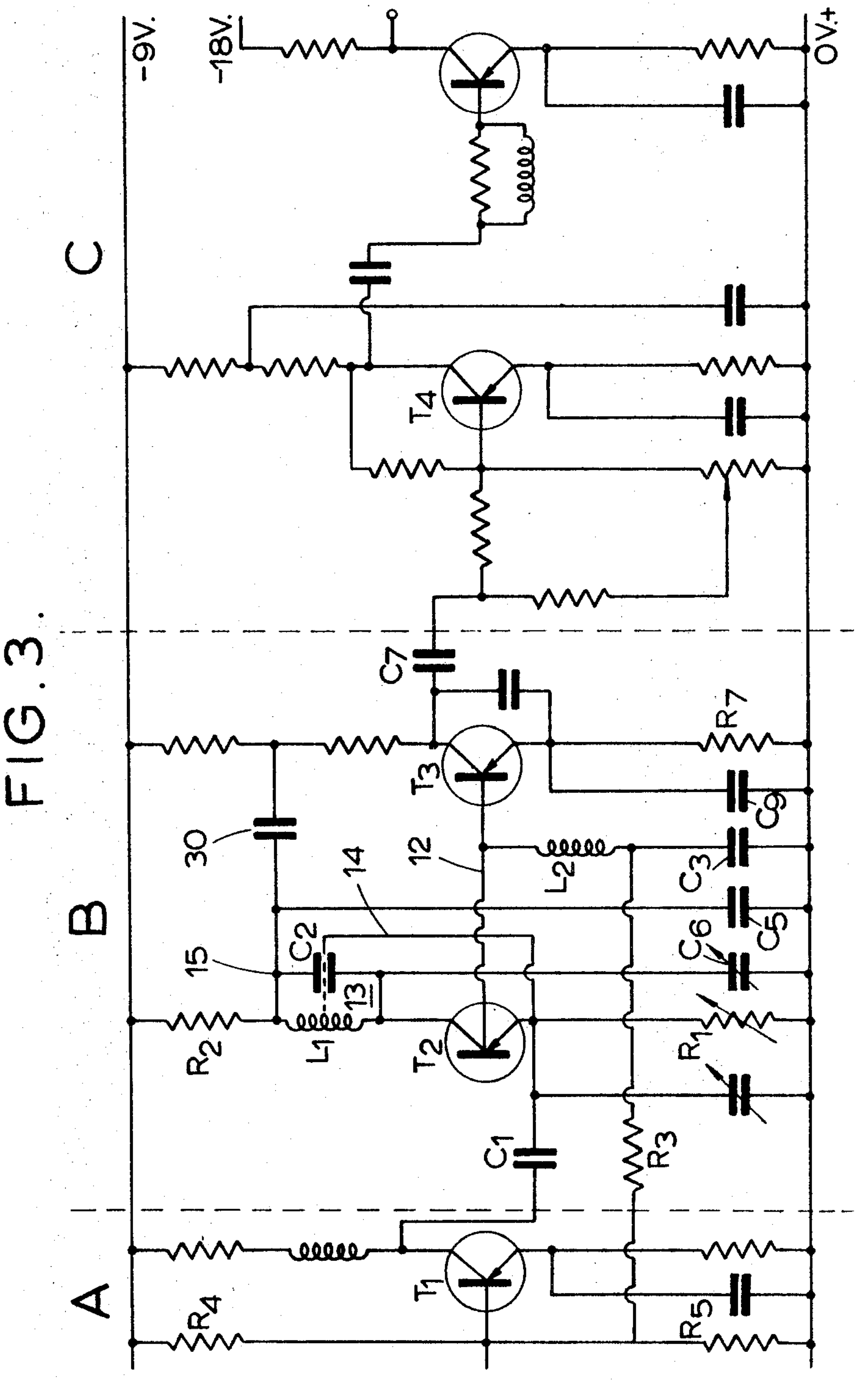

Embodiments of the invention will now be described, by way of example only, with reference to the accompanying drawings, in which:

FIG. 1 is a circuit diagram of the major portion of a radio receiver, the Figure being separated for convenience into FIGS. 1A, 1B and 1C, FIG. 1B showing an oscillator according to the invention;

FIG. 2 is a circuit diagram similar to FIG. 1 but incorporating an intermediate frequency arrangement, the Figure likewise being separated into FIGS. 2A, 2B and 2C, FIG. 2B showing an oscillator according to the invention; and FIG. 3 is a circuit diagram of a portion of a television receiver, the Figure being separated into FIGS. 3A, 3B and 3C, FIG. 3B showing an oscillator according to the invention.

Referring firstly to FIG. 1, there is shown a circuit diagram of a radio receiver capable of receiving amplitude and frequency-modulated signals. The receiver comprises generally an aerial and tuned circuit arrangement (not shown), a radio frequency amplifier (FIG. 1A), a carrier signal-triggered oscillator and demodulator circuit arrangement (FIG. 1B) referred to in this specification as an oscillator, an audio frequency amplifier (FIG. 1C) and a loudspeaker or other electroacoustic transducer (not shown). For clarity in the drawing no tuning arrangement is shown since various methods of tuning the receiver to different desired frequency bands will occur to those skilled in the art. The radio frequency amplifier and the audio frequency amplifier shown in FIGS. 1A and 1C are substantially conventional, it being merely noted that the radio frequency amplifier includes a transistor $T_1$ connected in the common emitter configuration.

In operation, the amplified signal in the desired selected frequency band from the radio frequency amplifier is coupled through a capacitor $C_1$ to the emitter circuit of a transistor $T_2$. The base of transistor $T_2$ is directly connected through line 12 to the base of a similar transistor $T_3$. A resonant circuit 13 is provided in the collector circuit of transistor $T_2$, the circuit 13 being tuned to the selected frequency band. The resonant circuit 13 comprises a parallel connected inductor $L_1$ and capacitor $C_2$. An end of a tickler lead 14 is inserted within the ceramic casing of capacitor $C_2$ and sealed in position. Lead 14 is connected to the emitter of transistor $T_2$. The collector of transistor $T_3$ is reactively coupled to the resonant circuit by a connection 15. An adjustable resistor $R_1$, preferably in series with a fixed value resistor (not shown), for safety, completes the emitter circuit of transistor $T_2$.

It has been found that the provision of a feedback path by coupling the collector of $T_3$ to the resonant circuit 13, and by capacitively coupling the resonant circuit 13 to the emitter of $T_2$ in the manner described above results in a stable oscillator circuit which can readily be adjusted to be below the oscillating condition. The degree of departure below the oscillating condition can be adjusted by varying the resistance of resistor $R_1$.

A series connected inductor $L_2$ and electrolytic capacitor $C_3$ are connected between the direct base connection 12 of transistors $T_2$ and $T_3$ and positive. This series connection is bridged by a low value adjustable capacitor $C_4$. The base line 12 is biased by means of a DC bias line 16 connected between the junction of $L_2$ and $C_3$ and a potential divider 10 in the radio frequency amplifier (FIG. 1A). The line 16 also effectively couples together the bases of the three transistors $T_1$, $T_2$ and $T_3$ and thus provides automatic volume or gain control. Components $L_2$, $C_3$ and $C_4$ may be regarded as a filter network or tuned circuit to minimize any unwanted radio or other nonaudio frequency signals on line 12. $T_3$ may then possibly be regarded as operating as a matching amplifier.

Variation of capacitor $C_4$ can also serve to vary the sensitivity of the circuit. The sensitivity may be increased by increasing the value of $C_4$, at the same time reducing the bandwidth to a convenient level. Should its value be increased too far, however, the circuit may go into complete, undesired, regeneration. Decoupling capacitor $C_5$ and variable capacitor $C_6$ also serve in balance to assist in establishing the oscillator in the desired condition about 10 percent below the oscillating condition.

In operation, when an unmodulated signal having a frequency substantially equal to the resonant frequency of circuit 13 is applied to the emitter of transistor $T_2$ excitation takes place and the oscillator commences stable oscillation in synchronism with the incoming unmodulated signal. This is because of the injection of the signal through tickler lead 14 into the resonant circuit 13 on the collector circuit of transistor $T_2$. The stability of the oscillation is assisted by the coupling of the collector of transistor $T_3$ to the circuit 13. The output level on the base of $T_2$ remains substantially zero with the unmodulated input signal.

When the input signal comprises an amplitude or frequency modulated carrier frequency signal the oscillator again oscillates (in synchronism with the carrier frequency) and again substantially no carrier frequency signal appears on the base of $T_2$. The transistor $T_2$ may now be regarded as having a stable carrier frequency signal at its collector and a modulated carrier frequency signal at its emitter. These two signals are inherently mixed within transistor $T_2$ (acting apparently as a resistive mixer) to provide on the base line 12 a signal consisting substantially only of the modulation envelope, i.e. the demodulation pattern in the case of amplitude modulation or the demodulation pattern due to deviation frequency in the case of frequency modulation. In either case transistor $T_2$ may be regarded as serving basically as a matching amplifier, the tuned circuit comprising $L_2$, $C_3$ and $C_4$ serving substantially wholly to remove any unwanted and/or spurious radio frequency signals from line 12. The presence of electrolytic capacitor $C_3$ has been found to be particularly important in this connection.

It is not absolutely certain that the oscillator functions precisely as described above. However a full theoretical explanation is not necessary for the practical construction of oscillators according to the invention. In particular it is suspected that due to slight phase lags transistor $T_2$ may operate at a frequency slightly different from the carrier frequency. This frequency may be about 20 to 25 kilocycles per second above or below an input at 100 megacycles per second. It is thought that a signal of the order of 20 to 25 k.c.p.s. may appear on line 12 in addition to the demodulation pattern and in that case it may be significant that electrolytic capacitor $C_3$ appeared under test (on a particular circuit where $C_3$ was a 100 microfarad capacitor) to pass frequencies above about 25 k.c.p.s. but to have minimum effect below this frequency. Finally it is thought that any 20 to 25 k.c.p.s. remaining on line 12 could be removed by the base-emitter junction of transistor $T_3$.

Transistor $T_3$ is connected to drive transistor $T_4$ in the audio frequency amplifier (FIG. 1C) through capacitor $C_7$, capacitor $C_8$ assisting in removing any spurious radio frequency signals appearing at the collector of $T_3$.

In a particular embodiment of the oscillator shown in FIG. 1B, the two transistors were each an AF118 and other components were as follows:

| | | | |
|---|---|---|---|
| $C_1$ | 500 pf. | $C_5$ | 500 pf. |
| $C_2$ | 5 pf. | $C_7$ | 10 $\mu$f. |
| $C_3$ | 100 $\mu$f. | $C_8$ | 500 pf. |
| $C_4$ | 30 pf. | $C_9$ | 100 $\mu$f. |
| $R_1$ | 5—6 k ohm | $R_5$ | 5.6 k |
| $R_2$ | 1 k | $R_6$ | 1 k |
| $R_3$ | 10 k | $R_7$ | 5.6 k |
| $R_4$ | 15 k | $R_8$ | 1 k |

The measured gain of $T_2$ in this circuit appeared to be above 15,000. Additionally the circuit was relatively insensitive to high peaking input signals such as ignition noise and neither was there found to be much variation in the output level when the input level varied between less than one microvolt to several millivolts.

The described receiver circuit has the following advantages. The circuit contains only four transistors and yet provides a high quality, substantially noise-free audio output signal for AM or FM input signals. The circuit is exceptionally stable with regard to temperature variation. No delicate adjustment is necessary during manufacture, and the circuit may be assembled satisfactorily using 10 percent capacitors and resistors. Radiation at any frequency other than the incoming carrier frequency is also minimized. Moreover the number of resistors employed is low and the overall gain and sensitivity of the circuit are high. Automatic volume control is inherently provided.

Finally, since the oscillator produces no output in the absence of an input signal to the oscillator at the oscillator frequency, there is no audio output (typically a loud hiss as associated with conventional VHF receivers) from the circuit when the circuit is not tuned to a particular selected band.

Referring now to FIG. 2 there is shown the major portion of a radio receiver similar to that shown in FIG. 1 except that it incorporates an intermediate frequency arrangement so that it rejects amplitude modulated signals, but demodulates frequency modulated signals substantially as described in connection with FIG. 1. In FIG. 2 a tuned coil 20 is connected between the baseline 12 and electrolytic capacitor $C_3$, the coil 20 being tuned to the desired intermediate frequency. A further tuned coil 21 is provided between the collector of $T_3$ and the resonant circuit 13, this coil 21 also being tuned to the intermediate frequency.

$T_2$ and resonant circuit 13 are triggered into oscillation at the difference frequency when the carrier frequency is present at the emitter of transistor $T_2$. In effect the oscillator frequency and the carrier frequency are mixed in $T_2$ to give the intermediate frequency signal on line 12 which is subsequently detected by the base emitter junction of $T_3$.

Referring now to FIG. 3, there is shown a portion of a television receiver. The arrangement and operation of the circuit is generally similar to that described in relation to FIG. 1 except that the component values are different in view of the different frequencies involved. For the same reason the collector circuit of transistor $T_3$ is in this embodiment capacitively coupled to the resonant circuit 13 through a capacitor 30.

Oscillators according to the invention can also find application in the demodulation of suppressed carrier-modulated signals.

I claim:

1. An oscillator including a first and a second transistor, means directly connecting the bases of said first and second transistor, a resonant circuit in the collector circuit of said first transistor, means reactively coupling the collector of said second transistor to said resonant circuit, and means reactively coupling said resonant circuit to the emitter of the first transistor to establish a feedback path, the degree and phase of said coupling being such that the oscillator only oscillates when a signal having a frequency substantially equal to the resonant frequency of said resonant circuit is present at the emitter of said first transistor.

2. An oscillator according to claim 1 wherein said means reactively coupling said resonant circuit to said first emitter comprises capacitive means.

3. An oscillator according to claim 2 wherein said capacitive means comprises a capacitor connected in said resonant circuit and a tickler lead connected to said first emitter and disposed adjacent said capacitor.

4. An oscillator according to claim 1 including a series connected inductor and electrolytic capacitor and means connecting said bases of said transistors through said inductor and electrolytic capacitor to ground.

5. An oscillator according to claim 4 including a DC bias line and means connecting said DC bias line to the junction of said series connected inductor and electrolytic capacitor.

6. A circuit arrangement for demodulating amplitude modulated signals and frequency modulated signals, said arrangement comprising an oscillator including a first and a second transistor, means directly connecting the bases of said first and second transistor, a resonant circuit in the collector circuit of said first transistor, means reactively coupling the collector of said second transistor to said resonant circuit, and means reactively coupling said resonant circuit to the emitter of the first transistor to establish a feedback path, the degree and phase of said coupling being such that the oscillator only oscillates when a signal having a frequency substantially equal to the resonant frequency of said resonant circuit is present at the emitter of said first transistor, coupling means for coupling modulated signals in a selected frequency band to the emitter of said first transistor, wherein said resonant circuit has a resonant frequency substantially equal to the carrier frequency of a signal it is desired to demodulate.

7. A circuit arrangement according to claim 6 wherein said coupling means comprises a capacitor connected to the emitter of said first transistor.

8. A radio receiver for receiving amplitude modulated signals and frequency modulated signals, said receiver including a radio frequency amplifier, coupling means coupling the output of said amplifier to an oscillator, wherein said oscillator includes a first and a second transistor, means directly connecting the bases of said first and second transistor, a resonant circuit in the collector circuit of said first transistor, means reactively coupling the collector of said second transistor to said resonant circuit, and means reactively coupling said resonant circuit to the emitter of the first transistor to establish a feedback path, the degree and phase of said coupling being such that the oscillator only oscillates when a signal having a frequency substantially equal to the resonant frequency of said resonant circuit is present at the emitter of said first transistor, an audio frequency amplifier, and means coupling the collector of said second transistor of said oscillator to said audio frequency amplifier.

9. A television receiver including a radio frequency amplifier, coupling means coupling the output of said amplifier to an oscillator, wherein said oscillator includes a first and a second transistor, means directly connecting the bases of said first and second transistor, a resonant circuit in the collector circuit of said first transistor, means reactively coupling the collector of said second transistor to said resonant circuit, and means reactively coupling said resonant circuit to the emitter of the first transistor to establish a feedback path, the degree and phase of said coupling being such that the oscillator only oscillates when a signal having a frequency substantially equal to the resonant frequency of said resonant circuit is present at the emitter of said first transistor, a video frequency amplifier and means coupling the collector of said second transistor of said oscillator to said video frequency amplifier.

10. An oscillator including a first and a second transistor, means directly connecting the bases of said first and second transistor, a resonant circuit in the collector circuit of said first transistor means reactively coupling the collector of said second transistor to said resonant circuit, and means reactively coupling said resonant circuit to the emitter of the first transistor to establish a feedback path, the degree and phase of said coupling being such that the oscillator oscillates substantially at the resonant frequency of said resonant circuit only when a signal having substantially a predetermined frequency is present at the emitter of said first transistor.